(12) United States Patent
Lender, Jr. et al.

(10) Patent No.: US 9,083,291 B2
(45) Date of Patent: Jul. 14, 2015

(54) LOW VOLTAGE HIGH EFFICIENCY GALLIUM ARSENIDE POWER AMPLIFIER

(75) Inventors: Robert J. Lender, Jr., Pepperell, MA (US); Douglas M. Dugas, Chelmsford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 86 days.

(21) Appl. No.: 13/879,507

(22) PCT Filed: Aug. 12, 2012

(86) PCT No.: PCT/US2012/050499
§ 371 (c)(1),
(2), (4) Date: Apr. 15, 2013

(87) PCT Pub. No.: WO2013/066466
PCT Pub. Date: May 10, 2013

(65) Prior Publication Data
US 2013/0321087 A1    Dec. 5, 2013

Related U.S. Application Data

(60) Provisional application No. 61/522,748, filed on Aug. 12, 2011.

(51) Int. Cl.
*H03F 3/191* (2006.01)
*H03F 3/21* (2006.01)
(Continued)

(52) U.S. Cl.
CPC ................. *H03F 3/21* (2013.01); *H03F 3/195* (2013.01); *H03F 3/245* (2013.01); *H03F 3/191* (2013.01)

(58) Field of Classification Search
CPC . H03F 3/1935; H03F 3/193; H03F 2200/372; H03F 3/345; H03F 3/601; H03F 3/191; H03F 1/56; H03F 2200/387; H03F 2200/222; H03F 3/195; H03F 1/565; H03F 3/60; H03F 3/72; H03F 1/0261; H03F 3/245; H03F 2200/108; H03F 2203/7209; H03F 2203/7236; H03F 3/211; H03F 3/68; H03F 1/0277; H03F 1/0272; H03F 1/301; H03F 2200/408; H01L 29/66462; H01L 29/66318; H01L 27/0605; H01L 29/7783; H01L 29/802; H01L 29/155; H01L 21/8252; H01L 2924/10329; H01L 2924/10336; H01L 2924/10337
USPC .................................................. 330/277, 302
See application file for complete search history.

(56) References Cited

U.S. PATENT DOCUMENTS 5,491,450 A * 2/1996 Helms et al. .................. 330/277
6,177,841 B1 * 1/2001 Ohta et al. ..................... 330/302
(Continued)

FOREIGN PATENT DOCUMENTS

JP      2007-531402     11/2007

*Primary Examiner* — Khanh V Nguyen
(74) *Attorney, Agent, or Firm* — Joesph E. Funk; Daniel J. Long

(57) ABSTRACT

A low voltage, switch mode PHEMT power amplifier with a 0.1 µm gate length and a low loss, lumped element, output matching circuit is disclosed that provides high performance over a frequency range of 1.4 GHz-2.5 GHz. The amplifier makes use of monolithic circuit technology for the first stage and output transistor, and uses a printed circuit board with surface mount components for the output matching network. The power output of the power amplifier is stable over a range of 60 degrees centigrade, has high power efficiencies of 44-53% with greater than 2 watts output power over the frequency range of 1.4 GHz and 2.5 GHz. In addition, through drain voltage control, the output power can be varied over a wide range between about 0.8 to 2.5 watts while still maintaining a high efficiency in the range of 50±3%.

6 Claims, 4 Drawing Sheets

(51) Int. Cl.
*H03F 3/195* (2006.01)
*H03F 3/24* (2006.01)

(56) References Cited

U.S. PATENT DOCUMENTS

| | | | |
|---|---|---|---|
| 6,392,491 B1 * | 5/2002 | Ohkawa et al. | 330/302 |
| 6,784,732 B2 * | 8/2004 | Hajimiri et al. | 330/251 |
| 7,151,407 B2 * | 12/2006 | Grundlingh | 330/251 |
| 7,161,434 B2 * | 1/2007 | Rhodes | 330/302 |
| 8,174,322 B2 * | 5/2012 | Heijden et al. | 330/302 |
| 8,576,004 B2 * | 11/2013 | Dupuy et al. | 330/302 |
| 8,593,225 B2 * | 11/2013 | Hellberg | 330/302 |
| 2005/0110576 A1 | 5/2005 | Rhodes | |
| 2005/0270096 A1 | 12/2005 | Coleman | |
| 2006/0176114 A1 | 8/2006 | Tayrani et al. | |
| 2009/0066439 A1 | 3/2009 | Whelan et al. | |

\* cited by examiner

LOW VOLTAGE HIGH EFFICIENCY GALLIUM ARSENIDE POWER AMPLIFIER

RELATED APPLICATION

This application claims the benefit of U.S. Provisional Application 61/522,748 filed Aug. 12, 2011, which is incorporated herein in its entirety by reference.

STATEMENT OF GOVERNMENT INTEREST

The invention was made with United States Government assistance under contract No. BAE-SC-08-0388 awarded by a classified customer. The United States Government has certain rights in the invention.

FIELD OF THE INVENTION

The present invention relates to Pseudomorphic High Electron Mobility Transistors (PHEMT), and more particularly to compact, low voltage, high efficiency, switch-mode PHEMT power amplifiers.

BACKGROUND OF THE INVENTION

In many applications, particularly for mobile hand-held devices, solid-state power amplifiers are typically the most costly component and are the largest user of electrical power of all components in such devices. Mobile hand-held devices typically utilize batteries, with battery life a significant concern in wireless communications devices such as cellular telephones, pagers, wireless modems, laptop computers with wireless capability, etc. Radio-frequency transmission, especially, consumes considerable power. A contributing factor to such power consumption is inefficient power amplifier operation. A typical RF power amplifier for wireless communications operates with only about 10% efficiency. Clearly, a low-cost technique for significantly boosting amplifier efficiency is needed.

To accommodate the power consumed by such power amplifiers the batteries utilized by such handheld devices are relatively heavy, expensive and occupy a fair amount of space in the hand-held devices. There is always a design tradeoff between the weight and size of a battery and the operational life of the battery. Increasing the efficiency of power amplifiers used in hand-held devices reduces the amount of power consumed, and can therefore decrease battery size and weight, or increase device operating life.

Current low-voltage power amplifiers may lose efficiency over temperature variations and drain voltage variations (between about 2-4V). Increased battery power consumption may results from this lack of efficiency. Current low-voltage power amplifiers may also have limited bandwidth coverage. A need therefore exists in the art for a compact, reliable, high-efficiency power amplifier for operating at low voltages, and over approximately one octave bandwidth.

As is known, pseudomorphic high electron mobility transistors (PHEMTs) are extensively used in wireless communication systems for switching, power and low noise amplifier applications. These transistors find wide market acceptance because of their high RF gain and power added efficiency (PAE), low noise figure (NF) and high reliability. The excellent properties of these transistors also make them attractive for use in satellite communication systems including direct broadcast satellite television (DBS-TV) and global satellite communication systems. PHEMT technology is also used in high-speed analog and digital IC's such as 2.5-10 Gb/s light wave communication systems. The higher frequency response of PHEMTs are currently finding use in millimeter wave communications (40 Gb/s) and radar systems.

In the prior art, to increase the RF power that a PHEMT transistor amplifier can supply, the width of the gate finger of the transistor is increased. However, the bandwidth of the transistor is reduced as the gate width is increased. To adjust for this decreased bandwidth, in the prior art a transistor with a shorter gate finger width is utilized since the frequency response of the transistor is inversely proportional to the gate finger width. The number of individual transistor cells connected in parallel, which form the total gate periphery, is increased. However, this increases the physical size of the PHEMT transistor's drain manifold, which decreases the frequency response. In addition, prior art PHEMT power transistors operate at relatively high voltages.

Thus, there is a need in the prior art for a PHEMT transistor power amplifier that can deliver increased power over a broad bandwidth but being smaller than equivalent prior art PHEMT transistor power amplifiers, and having high-efficiency, being very reliable and capable of operation at low voltages. Further, there is a need for a PHEMT transistor power amplifier that can operate at low voltages on the order of 3.3 volts, which matches the voltage of many current batteries, and therefore reduces battery weight compared to prior art battery powered PHEMT transistor power amplifiers. In addition, there is a need for a PHEMT transistor power amplifier that has improved power handling capability in a small size while operating at lower temperatures due to the increased efficiency of the transistor.

SUMMARY OF THE INVENTION

The differences of the prior art are met by the present invention. The applicant's novel, single recess (SR), pseudomorphic high electron mobility transistor (PHEMT) power amplifier gets around the problems of prior art PHEMT power amplifiers by utilizing T-gate technology and increasing the gate width, but at the same time, decreasing the gate length to less than that in the prior art. The novel PHEMT transistor power amplifier has a shorter gate length, on the order of 0.1 μm, which permits longer gate widths to be utilized while maintaining a high $F_t$ in the transistor. This allows good waveshaping of the voltage and current waveforms due to the high gain at the $2^{nd}$ and $3^{rd}$ harmonic frequencies. In addition, this increases the power added efficiency (PAE) of the novel single recess (SR) PHEMT power amplifier so that its operating temperature is lower and it can operate at ambient temperatures with minimal heat sink due to the increased efficiency of the transistor.

The novel PHEMT transistor power amplifier also operates with low DC voltages, typically on the order of 3.3 volts, so it is ideal for battery powered applications. This low voltage operation rules out GaN, high voltage GaAs and other high voltage processes.

The novel PHEMT power transistor is coupled with a low loss, lumped element, output matching circuit that also helps overcome problems in the prior art that are described hereinabove. The PHEMT transistor power amplifier and output matching circuit is compact, and the transistor amplifier operates in a switched mode.

The output matching circuit is comprised of high quality factor, inexpensive, surface-mount lumped components on a separate substrate. The matching circuit provides the fundamental frequency match from the low optimal impedance required by the transistor to the system impedance of 50 ohms. It also incorporates frequency traps at the $2^{nd}$ and $3^{rd}$ harmonic frequencies, thereby presenting an optimum impedance at those frequencies to the transistor. This allows the transistor to operate in a switch mode where the voltage across the transistor is zero when current flows, and the current is zero during the part of the cycle when there is a voltage across the transistor.

The novel PHEMT transistor power amplifier has a gate length of 0.1 μm that allows control of the amplifier load conditions over many harmonics, and over a wide frequency range of 1.8:1 with a wide drain voltage operation (1.5V-4.0V) at >1.5 Watts of output power. PHEMT amplifiers of varying configurations are typically used at frequencies between 20-80 GHz but the novel PHEMT transistor power amplifier described herein is intended to operate with low-voltage applications at lower microwave frequencies of approximately an octave between 1.4 GHz and 2.5 GHz.

Further the novel PHEMT transistor power amplifier can achieve high power efficiencies of 44-53% with greater than 2 watts output power between the frequency range of 1.4 GHz to 2.5 GHz. In addition, the output power can be varied over a wide range between 0.8 to 2.5 watts while still maintaining a high efficiency in the range of 50±3%.

DESCRIPTION OF THE DRAWING

The invention will be better understood upon reading the following Detailed Description in conjunction with the drawing in which.

DETAILED DESCRIPTION

The invention is a novel power amplifier utilizing a pseudomorphic high electron mobility transistor (PHEMT) and a low loss, lumped element, output matching circuit to provide power efficiencies much higher than the 10% efficiency of prior art power amplifiers. The PHEMT power amplifier makes use of monolithic circuit technology for the first stage and output transistor, and uses a printed circuit board with surface mount components for the output matching network.

Figure 1:
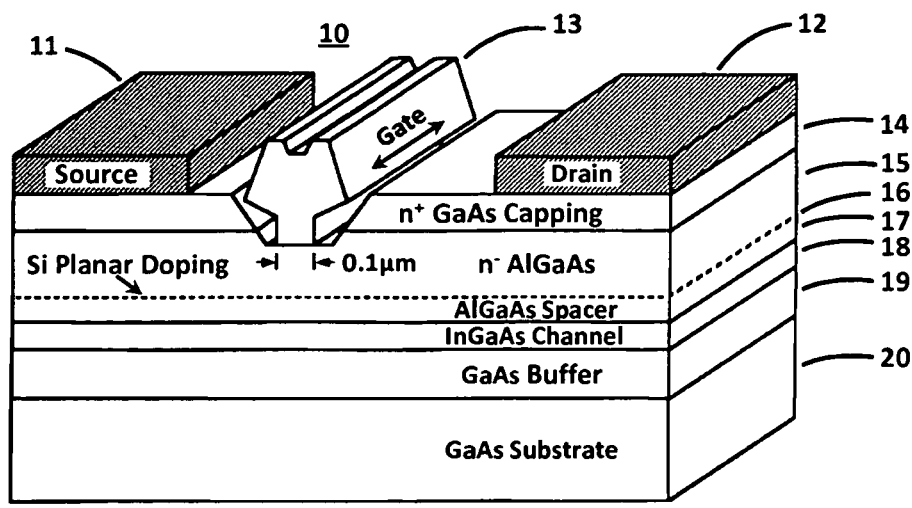
FIG. 1 is a cross sectional view showing the major structure of a preferred embodiment of a pseudomorphic high electron mobility transistor (PHEMT) transistor power amplifier device according to the present invention.

FIG. 1 is a representative cross sectional view of a PHEMT showing a T-gate having a gate length of 0.1 μm which helps improve the operation of the novel power amplifier. Other configurations of PHEMTs may be utilized in practicing the invention. The PHEMT in FIG. 1 is only described to understand the basics of a how a PHEMT is created. The PHEMT is grown using molecular beam epitaxy (MBE) which is a technique for epitaxial growth via the interaction of one or several molecular or atomic beams that occurs on a surface of a heated crystalline substrate, and isolated through mesa etching. The term "epitaxial" is applied to a film grown on top of a crystalline substrate in ordered fashion that atomic arrangement of the film accepts crystallographic structure of the substrate. The T-gates are defined by a Leica EBPG 5000 e-beam lithography system with a spot size of ~15 nm.

Most important is that a PHEMT utilized with the novel power amplifier of the preferred embodiment disclosed herein has a 0.1 μm gate length, a 200 μm unit gate width, and a 12.8 mm total gate width. However, a PHEMT utilized with the invention is not limited to these values. In manufacture a number of PHEMT devices are constructed in parallel to achieve a greater "total" gate width which also provides greater power handling capability. When mounted in an integrated package the complete power amplifier comprising the novel PHEMT and associated low loss, lumped element, output matching circuit occupy an area about one square centimeter.

Very basically PHEMT 10 is a field effect transistor (FET), which includes three terminals: (1) a source; (2) a drain; and (3) a gate. When a threshold voltage is applied to the gate, a "field effect" takes place in a region of semiconductor material under the gate, called the "gate region". The effect is either a build up of charge or a depletion of charge in the gate region. Which event occurs depends on the doping conductivity type of the gate region and the polarity of the gate voltage. The build up or depletion of charges creates a channel under the gate that electrically connects the source and the drain. If a channel is present while the drain region is biased with a voltage, and the source region is grounded relative to the drain region, then a current will flow through the channel between the drain and source regions.

The PHEMT 10 shown in FIG. 1 is based on a double-heterojunction epi structure. PHEMT 10 has a 2-mil GaAs substrate 20 upon which is eptaxially deposited aGaAs buffer layer 19. On top of GaAs buffer layer 19 is epitaxially deposited an InGaAs channel layer 18. The InGaAs channel layer 18 has doping on both sides to provide a higher sheet charge density for higher full channel current and output power. The InGaAs layer 18 provides controllable conductivity between the source 11 and drain 12.

An undoped AlGaAs spacer layer 17 is epitaxially deposited on top of InGaAs channel layer 18. Deposited on top of AlGaAs spacer layer 17 is a thin Silicon planar doping layer 16. Above the silicon doping layer 16 is epitaxially deposited an n⁻ ALGaAs layer 15 which is the Scottky layer and it is lightly doped.

Above the n⁻ AlGaAs layer 15 is epitaxially deposited a highly doped n⁺ GaAs capping layer 14 typically having a thickness of 1-100 nanometers. A gap is recess etched through n⁺ GaAs capping layer 14 to expose the top surface of the lightly doped n⁻ AlGaAs layer 15 in order to build T-gate 13 thereon. With recess etching of the highly doped n⁺ GaAs cap layer 14, a photoresist pattern (not shown) having an opening of a larger width and length than the base of gate electrode 13 is formed. Then the etching is applied to remove the unwanted material. This is done in several steps to create the sloped sides as shown in FIG. 1.

Figure 3:
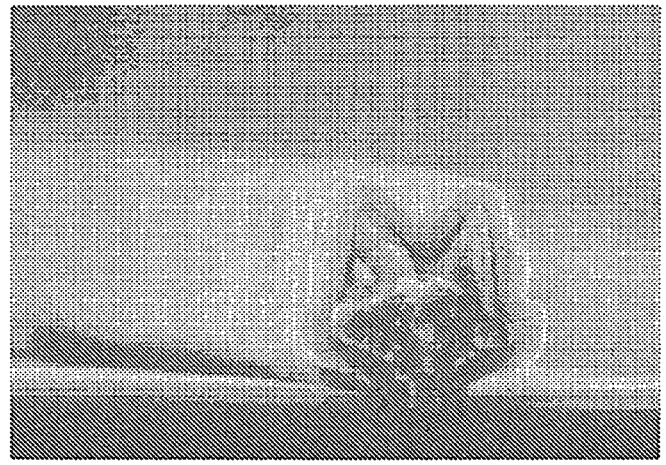
FIG. 3 is a cross section of a T-gate of the PHEMT transistor that has a 0.1 μm gate length.

Additional, selective, recess etching is used to create a small well in the top surface of n⁻ GaAs capping layer 15 and T-gate 13 is deposited on layer 15 starting in this well. This is the single recess of PHEMT 10. A picture of the T-gate is shown in FIG. 3.

T-gate 13 is deposited on top of n⁻ ALGaAs layer 15. A T-gate structure allows gate-to-source capacitance and gate finger resistance to be significantly reduced, allowing PHEMT 10 to operate at higher operating frequencies which is advantageous for the present invention. It can be seen in FIG. 1 that the base of gate 13 has a gate length dimension of 0.1 µm. A gate 13 is typically created using bi-layer resist, e-beam lithography, followed by TiPtAu metallization of gate 13 to form a Schottky junction between gate 13 and layer 15.

In the equivalent circuit of PHEMT 10 there are 2 diodes—a gate-source diode and a gate-drain diode. The reverse breakdown of the gate-drain diode often limits the power performance, even in a low-voltage operation. Even though the novel power amplifier described herein is a low-voltage operation the instantaneous voltage in operation of a switch-mode amplifier is greater than three times the quiescent drain voltage. Another advantage of using this process is that there is a very good off-state breakdown despite the small 0.1 µm gate-length.

On top of the left hand portion of capping layer 14 is a first ohmic contact which is the Source terminal 11 of the PHEMT, and on top of the right hand portion of capping layer 14 is a second ohmic contact which is the Drain terminal 12 of PHEMT 10. The Source and Drain terminals 11 and 12 are formed of AuGe metal thin films having a typical contact resistance of 0.11 Ω-mm. Typically, the AuGe metal thin film is formed on the n⁺ GaAs cap layer 14 and is subjected to rapid thermal annealing (RTA) to form the Source electrode 11 and the Drain electrode 12 is in ohmic contact with the n⁺ GaAs cap layer 14. Therefore, these electrodes have a low contact resistance with the n⁺ GaAs cap layer 14 which increases the breakdown voltage and maintains the knee voltage low, thereby improving device power characteristics.

Although not shown in FIG. 1, a thin Au layer is electroplated on top of both Source electrode 11 and Drain electrode 12 and they are connected to respective source pad and drain pads thereby resulting in the a PHEMT utilized in the novel power amplifier. After the ohmic contacts have been formed, a protective insulating layer (not shown), for example, a silicon nitride layer, is formed to protect any exposed surface of the n⁺ GaAs capping layer 14.

Figure 2:
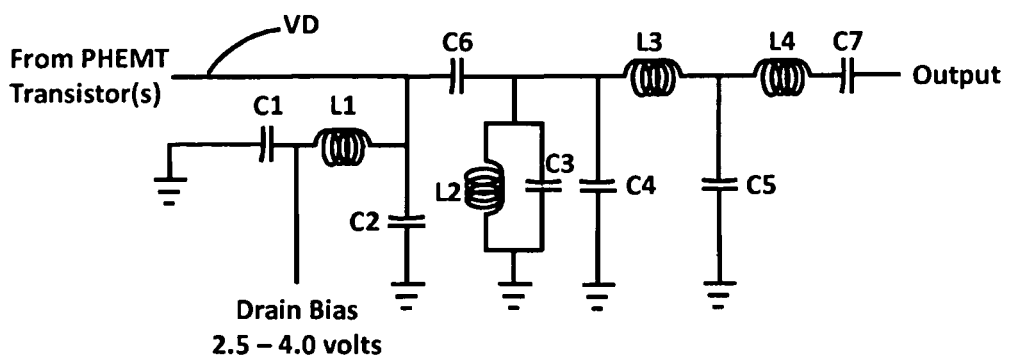
FIG. 2 is a schematic diagram of a low loss, lumped element, output matching circuit that is part of the power amplifier.

In FIG. 2 is shown a schematic diagram of a low loss, lumped element, output matching circuit/network that also helps overcomes the problems in the prior art that are mentioned in the Summary of the Invention with reference to this output matching circuit. The output matching circuit is comprised of high quality factor, inexpensive, surface-mount lumped components on a separate substrate. The matching circuit provides the fundamental frequency match from the low optimal impedance required by the PHEMT transistor to the system impedance of 50 ohms. In alternative embodiments of the invention the system impedance may be other than 50 ohms. It also incorporates frequency traps at the 2nd and 3rd harmonic frequencies, thereby presenting a optimum impedance at those frequencies to the transistor. This allows the transistor to operate in an optimum switch mode state where the voltage across the transistor is zero when current flows, and the current is zero during the part of the cycle when there is a voltage across the transistor.

A switch mode transistor operates as an on-off switch and the shapes of the current and voltage waveforms provide a condition where the high current and high voltage do not overlap simultaneously, to minimize the power dissipation and maximize the power amplifier efficiency. This is defined in the art as a Class E non-linear power amplifier, which have much higher efficiencies than linear amplifiers, and are used at such high frequencies that the switching time becomes comparable to the duty time. Class E amplifiers typically have a load network, which is the matching circuit (FIG. 2) of the present invention, which are capacitances and inductances. The PHEMT transistor is connected via a serial LC circuit of L4 and C7 to a load at the output of the matching network, and is connected via an inductor (not shown) to a supply voltage from the PHEMT transistors(s). The supply voltage is connected to ground via capacitor C2 to prevent any RF signals leaking into the supply voltage. Connected between capacitor C1 and inductor L1 is a drain bias voltage of between 2.5 volts and 4.0 volts. This drain bias voltage is sent via inductor L1 and lead VD to the drain contact 12 of the PHEMT transistor in FIG. 1. These drain bias voltages $V_d$ are shown in the graph in FIG. 7 and their effect on the power output and power added efficiency (PAE) performance of the PHEMT power amplifier over more than an octave bandwidth.

More particularly, capacitor C1 is a direct current (DC) bypass capacitor, capacitor C2 is a charge storage capacitor, capacitor C6 is a DC blocking capacitor blocking the DC voltage from the PHEMT transistor, and inductor L1 is a DC choke for drain bias injection. The remainder of the output matching circuit (L2, C3 and L3, C4, C5) is an impedance transforming network with a low-pass form which includes resonant filter networks comprising inductor L2 with capacitor C3 and inductor L4 with capacitor C7 for improved harmonic rejection. The parasitics of the pads and short interconnecting lines are absorbed into the filter network.

FIG. 3 is an enlarged picture of T-gate 13 of the PHEMT transistor in FIG. 1.

Figure 4:
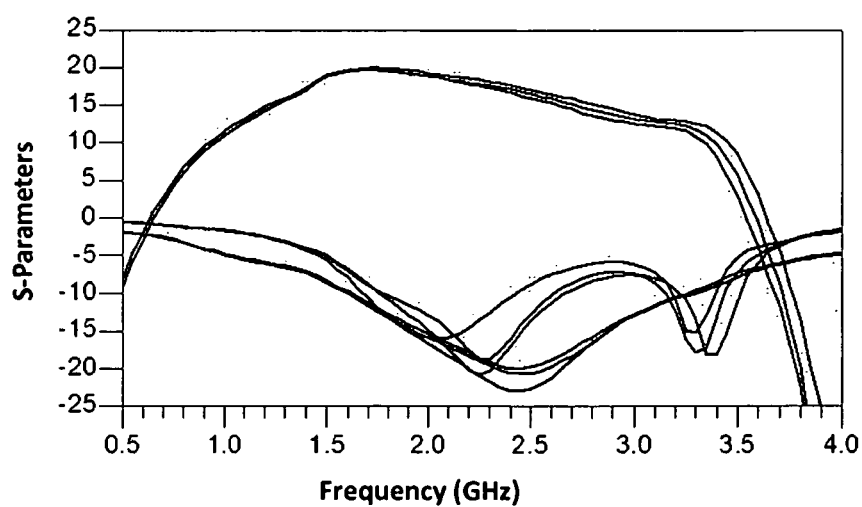
FIG. 4 is a graph showing the uniform gain of the novel PHEMT transistor power amplifier over a bandpass of 1.4 GHz to 2.5 GHz.

FIG. 4 is graph showing the uniform gain of the novel SR PHEMT transistor power amplifier over a bandpass of 1.4 GHz to 2.5 GHz. The SR PHEMT transistor power amplifier can achieve high power efficiencies of 44-53% with greater than 2 watts output power between the frequency range of 1.4 GHz and 2.5 GHz. In addition, the output power can be varied over a wide range between 0.8 to 2.5 watts while still maintaining a high efficiency in the range of 50±3% through drain bias control (see FIG. 7). The pass band of the amplifier is maintained over the range of 2.5 to 4 volts. Very repeatable performance is achieved through the use of monolithic implementation of the first stage of the amplifier as well as the second stage large periphery transistor. Three amplifiers are plotted in FIG. 4 and show consistent small-signal performance despite the current starved bias condition.

Figure 5:
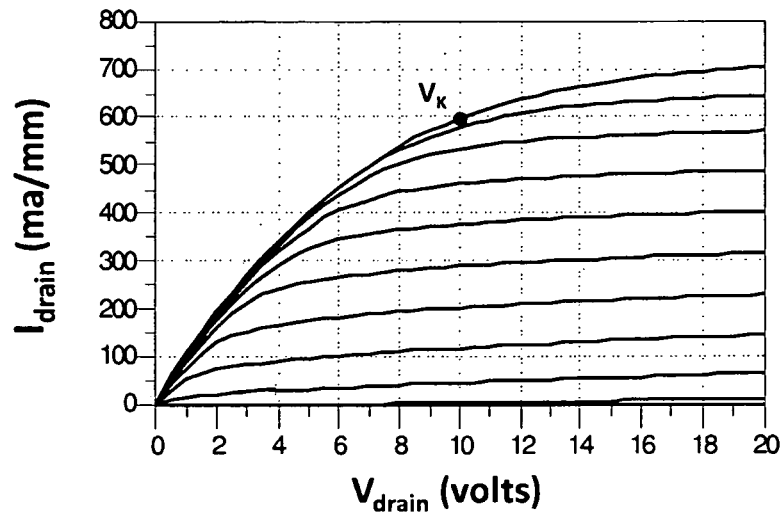
FIG. 5 is a graph showing IV characteristics of a prior art PHEMT transistor power amplifier device using Gallium Nitride (GaN)
Figure 6:
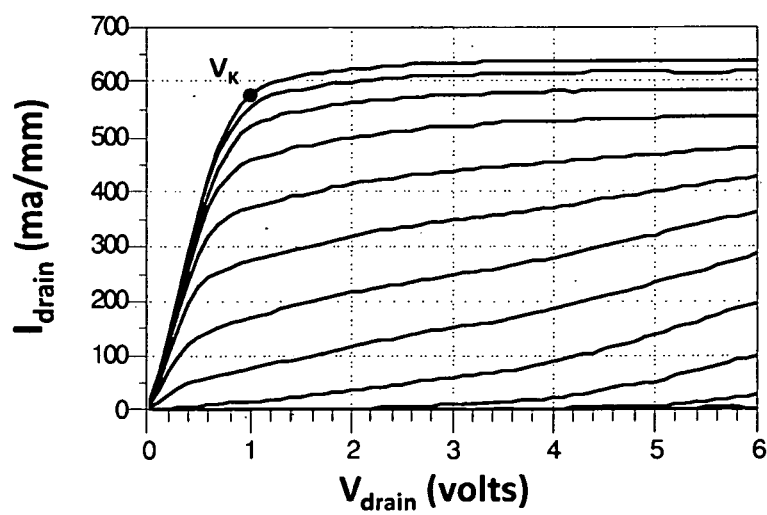
FIG. 6 is a graph showing IV characteristics of the novel PHEMT transistor power amplifier device using Gallium Arsenide (GaAs) that provides high gain at low voltages.

Regarding FIGS. 5 and 6, the single recess (SR) PHEMT 10 utilized in the novel power amplifier operates with a low Drain 12 voltage of 3.3 volts which limits power density and power added efficiency (PAE) and requires the use of a low knee voltage ($V_K$) process to compensate for same. The knee voltage is the voltage at which the IV response curves transition from "linear" to "saturation" and is shown in FIG. 6 for the GaAs material utilized. The knee voltage $V_K$ for a prior art GaN PHEMT is shown in FIG. 5. It can be seen in FIG. 5 that GaN is not practical for low voltage operation. Stated another way the forward operating region of the characteristic curve where conduction starts to increase rapidly is called the Knee voltage ($V_K$). This is shown in both FIGS. 5 and 6, but it can be seen that $V_K$ for Gallium Nitride (GaN) in FIG. 5 is much higher than the $V_K$ for Gallium Arsenide (GaAs) in FIG. 6. PHEMT 10 has a low knee voltage of 1.0 volts for GaAs. The low knee voltage permits maximize voltage swing and permits higher gain at lower voltages.

Expanding on the description of a PHEMT to be utilized with the novel power amplifier, the PHEMT transistor that is used in the novel power amplifier has a 0.1 µm gate length and is fabricated using 6 inch single-recess (SR) PHEMT MMIC fabrication that utilizes mostly cassette-to-cassette equipment in the foundry. The highly automatic wafer processing reduces human wafer handling and improves visual yield. The epitaxial layers of the PHEMTs are grown via molecular beam epitaxy (MBE) and are isolated through mesa etching. Ohmic contacts forming source and drain contacts are formed using a Au—Ge based process with a typical contact resistance of 0.11 Ω-mm. TaN is used for thin film resistors and two metal layers are used for interconnects. 0.1 µm T-gates are realized through bilayer resist, e-beam lithography and fully selective etching of the n+ cap, followed by Ti/Pt/Au metallization to form the Schottky junction. An example of a 0.1 µm T-gate is shown in FIG. 3. FETs are passivated using PECVD SiN followed by creation of 400 pF/mm$^2$ MIM capacitors. All wafers are fully backside processed using a 2-mil substrate process with small size slot vias to provide direct source grounding for reduced source inductance and improved thermal resistance. The 2-mil via technology is critical for high frequency power operation. Connection to the front side of the wafers is achieved with the use of plated Au.

The 0.1 µm gate length single-recess (SR) PHEMT utilized in the novel power amplifier is based on a double-heterojunction epi structure with doping on both sides of the InGaAs channel to provide a higher sheet charge density for higher full channel current and output power. Automated electrical testing of key process parameters are tracked using our process control monitor (PCM). Critical parameters such as the full channel current, $I_{dss}$, $g_m$, $BV_{gd}$, $V_{po}$, device isolation, thin film resistance, and capacitance are measured at different stages of the process and adjustments made accordingly. The SR PHEMT exhibits extrinsic transconductance of 570 mS/mm at $V_d$ of 2.5V with $I_{ds}$, max of 615 mA/mm. Off-state gate-drain breakdown was measured to be −11.5V with on-state channel breakdown of 7V ($V_{gs}$=−0.3V). Table I immediately below shows the tight distribution of device DC characteristics as well as the extremely high DC and RF spec yield.

TABLE I

| Parameter | Unit | Value | Spec Yield |
| --- | --- | --- | --- |
| $I_{full}$ | mA/mm | 615 (±3%) | 100% |
| $g_m$ | mS/mm | 570 (±6%) | 86% |
| $BV_{gd}$ | V | −11.5 (±5%) | 99% |
| S11 | dB | −20 (±2%) | 100% |
| S21 | dB | 13.75 (±.25%) | 94% |
| $P_{out}$ in | dBm | 27.5 (±.25%) | 88% |

The definitions of the terms in Table I are as follows.
$I_{full}$—channel current at $V_{gs}$=±0.6V
$BV_{gd}$—gate-to-drain breakdown voltage at $V_{gd}$=1 ma/mm
$g_m$—peak transconductance
S11—small signal input return loss
S21—small signal gain With the improved power efficiencies of the novel PHEMT power amplifier, significant improvements are seen in performance degradation usually due to temperature. Output power levels were changed over a range of 9% while the temperature of the device remained at close to 60 degrees Celsius degrees. Thus, the high efficiency operations described above results in minimal self-heating while maintaining a low channel temperature. Low temperatures in turn provide increased reliability of the device.

Figure 7:
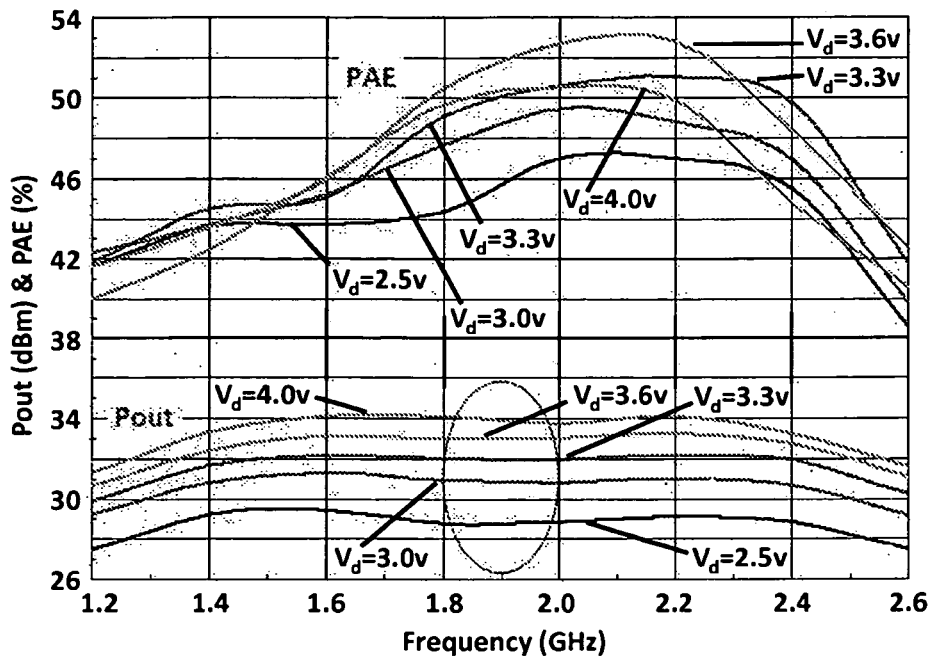
FIG. 7 is a graph showing constant power output ($P_{out}$) and increasing power added efficiency (PAE) from the novel power amplifier between 1.4 and 2.4 GHz for drain voltages ($V_d$) between 2.5 and 4.0 volts.

FIG. 7 shows the power output and power added efficiency (PAE) performance of the PHEMT power amplifier over approximately an octave bandwidth versus drain voltage $V_d$. Over a 2.5-4.0 V volt drain voltage range the PAE of the amplifier is maintained within +/−3% while the power can be adjusted over a 5 dB range. The overall bandpass response is maintained over the full 5 dB $P_{out}$ range. This is significant in that the drain voltage $V_d$ can be used to reduce the power output and save battery life during periods when lower RF power output is required, at no loss in efficiency.

Figure 8:
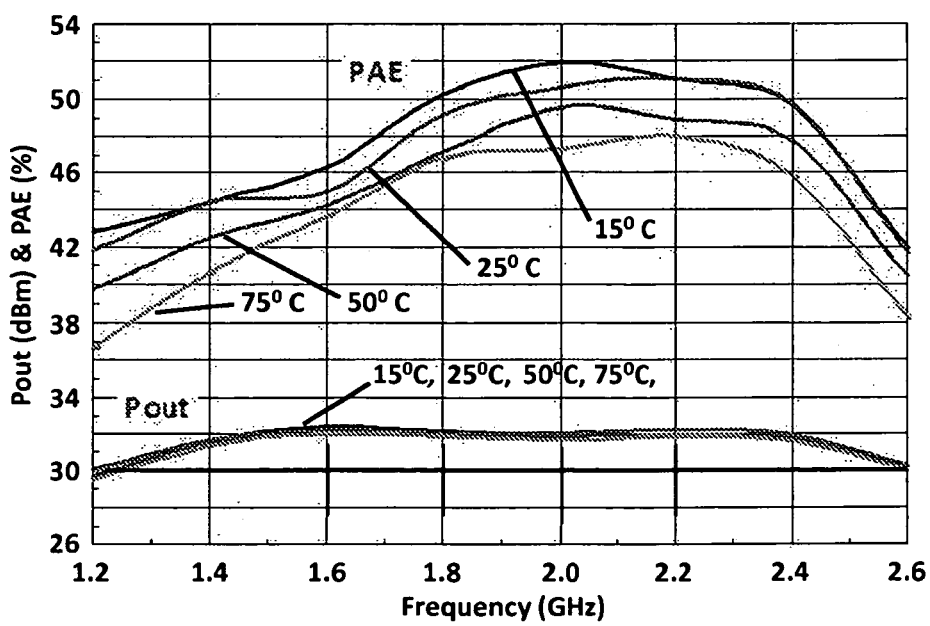
FIG. 8 is a graph showing constant power output ($P_{out}$) from the novel power amplifier between 1.4 and 2.4 GHz over an operating temperature of a range of 60° C.

FIG. 8 shows the results of more extensive high temperature tests performed on V-band dual-stage full power PHEMTs. During the test, the PHEMTs were biased at $V_{ds}$=4.5V under 4.5 dB compression. FIG. 8 shows the MMIC high temperature power stability over a range of 15° C. to 75° C. It is important to note that the average power deviation is only 0.4 dB over the temperature range of 60° C. This is a very small deviation of 0.007 dB/C.

The applicant's novel power amplifier operates with the PHEMT being operated in switch mode. To operate in this mode it is necessary to drive the PHEMT rapidly between cutoff and full-on, and then back to cutoff, in a repetitive manner. In switch mode the gate voltage is merely used to switch the device from a resistive element to a small capacitive element. As previously described with reference to FIG. 2, the output matching circuit provides the fundamental frequency match from the low optimal impedance required by the transistor to the system impedance of 50 ohms. It also incorporates frequency traps at the 2nd and 3rd harmonic frequencies, thereby presenting an optimum impedance at those frequencies to the transistor. This allows the transistor to operate in the switch mode where the voltage across the transistor is zero when current flows, and the current is zero during the part of the cycle when there is a voltage across the transistor.

In summary, in testing of the novel PHEMT power amplifier efficiencies of 44% to 53% were achieved with output power levels being greater than 2 Watts between the frequency range of 1.4 GHz and 2.5 GHz. In one configuration of the PHEMT power amplifier where its output power was varied over a wide range of 0.8 Watts to 2.5 Watts the power efficiency of the amplifier was in the range of 50%+3%. To achieve this level of performance the PHEMT transistor power amplifier has a gate length of 0.1 µm that allows control of the amplifier load conditions over many harmonics, and over a wide frequency range of 1.8:1 with a wide drain voltage operation (2.5V-4.0V) at >1.5 Watts of output power.

While what has been described herein is a preferred embodiment of the invention, those skilled in the art will recognize that numerous changes may be made without departing from the spirit and scope of the invention.

The invention claimed is:
1. A pseudomorphic high electron mobility transistor (PHEMT) power device (10) comprising:
   a GaAs substrate (20);
   a GaAs buffer layer (19) that is on top of substrate (20);
   an InGaAs channel layer (18) that is on top of substrate (20), layer (18) having doping on both sides to provide a higher sheet charge density for higher full channel current and output power, and to provide controllable conductivity between the source electrode (11) and drain electrode (12);
   an undoped AlGaAs spacer (17) that is on top of InGaAs channel layer (18), spacer (17);
   a thin Silicon planar doping layer (16) that is on top of spacer (17);

a lightly doped n⁻ AlGaAs layer (15) that is on top of layer (16) and layer (15) is a Schottky layer;

an n⁺ GaAs capping layer (14) that is on top of layer (15), layer (14) having a recess etched there through to expose an area on the top surface of the lightly doped n⁻ AlGaAs layer (15);

a T-gate (13) that is on top of layer (15) and extends through the recess through capping layer (14), and the T-gate (13) having a first and a second opposite sides;

a source electrode (11) that is on top of capping layer (14) on the first side of T-gate (13) and it forms an ohmic contact with layer (14);

a drain electrode (12) that is on top of capping layer (14) on the second side of T-gate (13) and it forms an ohmic contact with layer (14); and a protective insulating layer that is on top of the n+ GaAs capping layer (14), but not on electrodes (11) and (12), to protect any exposed surface of layer (14);

wherein the InGaAs layer (18) has doping on both sides to provide a higher sheet charge density for higher full channel current and output power and this provides controllable conductivity between the source electrode (11) and the drain electrode (12).

2. The pseudomorphic high electron mobility transistor (PHEMT) power device (10) of claim 1 wherein the T-gate (13) has been metallized with TiPtAu to form a Schottky junction between gate (13) and n⁻ AlGaAs layer (15).

3. The pseudomorphic high electron mobility transistor (PHEMT) power device (10) of claim 2 wherein T-gate (13) has a small gate length of 0.1 μm, the small gate length allowing control of the power device (10) over many harmonics, and over a wide frequency range of 1.8:1 with a wide drain voltage operation (15V-4.0V) at >1.5 Watts of output power.

4. The pseudomorphic high electron mobility transistor (PHEMT) power device (10) of claim 3 wherein T-gate (13) has a unit gate width of 200 μm, and a 12.8 mm total gate width.

5. The pseudomorphic high electron mobility transistor (PHEMT) power device (10) of claim 1 wherein T-gate (13) has a small gate length of 0.1 μm, the small gate length allowing control of power device (10) over many harmonics, and over a wide frequency range of 1.8:1 with a wide drain voltage operation (15V -4.0V) at >1.5 Watts of output power.

6. The pseudomorphic high electron mobility transistor (PHEMT) power device (10) of claim 5 wherein T-gate (13) has a unit gate width of 200 μm, and a 12.8 mm total gate width.

* * * * *